United States Patent
Mahlab et al.

(10) Patent No.: US 6,583,904 B1
(45) Date of Patent: Jun. 24, 2003

(54) METHOD AND APPARATUS FOR ALIGNING OPTICAL INTERCONNECTIONS BETWEEN PRINTED CIRCUIT BOARDS

(75) Inventors: Uri Mahlab, Or Yehuda (IL); Hertzel Yehezkely, Rosh-Haayan (IL)

(73) Assignee: ECI Telecom Ltd., Petach Tikva (IL)

( * ) Notice: Subject to any disclaimer, the term of this patent is extended or adjusted under 35 U.S.C. 154(b) by 0 days.

(21) Appl. No.: 09/409,751

(22) Filed: Oct. 1, 1999

(51) Int. Cl.$^7$ ............................................... H04B 10/10
(52) U.S. Cl. ..................... 359/159; 359/193; 359/194; 359/172
(58) Field of Search ................. 359/159, 163, 359/172, 122, 156, 194, 193

(56) References Cited

U.S. PATENT DOCUMENTS

| | | | | |
|---|---|---|---|---|
| 5,606,439 A | * | 2/1997 | Wu | 349/117 |
| 5,638,203 A | | 6/1997 | Hasegawa et al. | 349/139 |
| 5,648,859 A | | 7/1997 | Hirabayashi et al. | 349/9 |
| 5,801,799 A | | 9/1998 | Chen et al. | 349/74 |
| 5,818,618 A | * | 10/1998 | Eastmond | 359/127 |
| 5,920,664 A | * | 7/1999 | Hirabayashi et al. | 385/16 |
| 6,166,838 A | * | 12/2000 | Liu et al. | 359/122 |
| 6,285,478 B1 | * | 9/2001 | Liu et al. | 359/122 |

FOREIGN PATENT DOCUMENTS

| | | |
|---|---|---|
| EP | 0 811 862 | 12/1997 |
| JP | 5 204001 | 8/1993 |

OTHER PUBLICATIONS

Hirabayashi et al. "Optical backplane with free-space optical interconnections using tunable beam deflectors and a mirror for bookshelf-assembled terabit per second class asynchronous transfer mode switch", (1998), *Optical Engineering*, vol. 37, No. 4, pp. 1332–1342.

Hirabayashi et al., "Free–space optical interconnections with liquid–crystal microprism arrays", (1995), *Applied Optics*, vol. 34, No. 14, pp. 2571–2580.

Parker, "Optical Interconnections for Electronics", (1992), *Proceedings of the European Conference on Optical Communication (ECOC), DE Frankfurt IGVDE*, vol. conf. 18, pp. 761–768.

"60 GHz board–to–board optical interconnection using polymer optical buses in conjunction with microprism couplers" Chen, et al. "Appl. Phys. Lett" Feb. 3, 1992, pp. 536–538.

"Holographic Optical Backplane Operated at 20 GBIT/s at 1.55 $\mu m$" Vincensini, et al. Proc. $21^{st}$ Eur. Conf. On Opt. Comm (ECOC'95—Brussels), pp. 879–882.

"Holographic coupling elements for optical bus systems based on a light–guiding optical backplane" Haumann, et al, Optics in Complex Systems, SPIE vol. 1319. pp 588–589.

* cited by examiner

Primary Examiner—Leslie Pascal
(74) Attorney, Agent, or Firm—Browdy and Neimark, P.L.L.C.

(57) ABSTRACT

Method and apparatus for the alignment of optical interconnections between at least one optical data transmission point and at least one corresponding optical data receiving point. A collimated beam of data carrying light is polarized through an electrically-controlled light polarizer, such as a spatial light modulator or a liquid crystal, which comprises an array of pixels. A focused beam of the data-carrying light, emitted from the light polarizer, is obtained on the receiving point, by individually controlling the polarization of each pixel, and deflecting the direction of the collimated beam when emitted from the light polarizer, until a predetermined value of an electrical signal (current and/or voltage) representing the level of alignment is obtained. The collimated beam is further continuously and/or adaptively aligned by determining a desired current and a threshold current and/or voltage produced by an optical sensor at the receiving point. A comparator circuitry compares the actual current produced by the optical sensor, to the threshold current, and a feedback loop controls each individual pixel according to the comparison result.

35 Claims, 3 Drawing Sheets

METHOD AND APPARATUS FOR ALIGNING OPTICAL INTERCONNECTIONS BETWEEN PRINTED CIRCUIT BOARDS

FIELD OF THE INVENTION

The present invention relates to the field of optical communications. More particularly, the invention relates to a method and apparatus for aligning optical interconnections between printed circuit boards (PCBs), by controlling the polarization of an information carrying light beam using electrically controlled polarizer, such as a Spatial Light Modulator (SLM).

BACKGROUND OF THE INVENTION

Many data communication systems, such as computers, use printed circuit boards for the integration of their electrical components. The architecture of modern electronic systems, and particularly of data processing systems, requires modular design, which is implemented by a set of PCBs, each of which is designed to fulfill specific functions. This modular design enables to more easily detect failures in the system, and to reduce production costs. Each PCB, which is frequently termed a "card", can be manufactured and tested separately, and then integrated into the system. Integration is carried out mainly by a main PCB that is often termed "motherboard" (in computers, such as a PC) or "backplane" (in other computerizes data communication systems), into which each card is inserted (using pins in each card, that are inserted into corresponding sockets in the backplane), and the electrical connection between them is established. The backplane provides to each card the basic required inputs, such as power lines, for operating its electrical components, and distributes a central clock signal to synchronize the operation between cards. In addition, the backplane collects digital information processed by each card via a corresponding data bus, and transfers this information to other components for further processing. The processing elements can be located on the backplane or on another card. In the example of a PC, the main processor is located at the motherboard, and memories are located on different cards. Therefore, high rate data is exchanged between each card and the motherboard, as well as between different cards, via electrical connection (data buses).

Several data communication systems require data exchange between cards in an extremely high rate. Available high speed data buses, such as a Gunning-Transceiver-Logic (GTL) (by Texas Instruments Inc., USA) bus operating at 100 MHz, allows data exchange at a rate of 100 Mb/Sec per each line. When a data rate of 2.5 Gb/Sec is required, more data lines are added to the bus and operate in parallel. However, as the demand for higher rates increases, the frequency bandwidth becomes wider, and cross-talk problems (i.e., the spectral components of the data propagating along each line overlap in frequency with those of other lines and interfere with each other) start to appear, and therefore the available bandwidth and the data rate of each line is limited. In addition, adding more lines in parallel becomes a practical solution only for very short distances.

In several data communication systems, ribbon cables are used to add more data lines externally to the printed data lines, so as to increase the rate of data exchange between cards, without exceeding bandwidth limitations due to cross-talk problems. However, using ribbon cables suffers from limitations when "hot" replacement (i.e., replacement of cards in an essentially "transparent" mode while the system is operating) of cards is required. In addition, using external ribbon cables to add data lines is also bandwidth-limited due to cross-talk problems. Therefore, backplane designs based on electrical data connections between cards are limited to a total throughput (the maximum data rate that can be processed without delaying incoming data) of 20 Gb/Sec. In addition, adding more electrical data lines to each card requires to increase the number of pins required to provide the electrical connection, which is also limited from mechanical and space aspects.

Another method for increasing the rate of data exchange between cards is to add an information-carrying optical link between the cards, in parallel to the electrical data bus. Such link is provided by modulating a light beam, such as a laser beam, with the data that should be transmitted. Using a light beam to carry the data almost removes the bandwidth limitations of a multi-line data bus. The modulated light beam is focused on the transmitting card and directed to a detector, which is normally a photo-diode detector, located at the receiving card. The laser beam is demodulated, and the data is recovered at the receiving card. However, since there are manufacturing and assembly tolerances, as well as mechanical effects caused by temperature changes of the cards and/or of the backplane, the alignment between the transmitting laser and the light receiving detector deteriorates with time, and should therefore be aligned.

Conventional techniques for the alignment of deflected light beams comprise using an array of optical devices, such as mirrors and prisms, which direct the beam back to the desired receiving point on the receiving card. "60 GHz board-to-board optical interconnection using polymer optical buses in conjunction with microprism couplers", Chen et. al, Applied Physics, Letter 60 (5), February 1992 discloses a board-to-board interconnection with enhanced speed using microprisms, which eliminates the need for backplane interconnection.

"Holographic optical backplane operated at 20 Gb/Sec at 1.55 $\mu$m", Vincensini et al., Proceedings 21st European Conference on Optical Communications, ECOC'95 Brussels, describes a realization of a holographic optical backplane, which performs interconnections and clock distribution for six electronic boards at 1.3 and 1.55 $\mu$m. High speed data transmission is provided at a data rate of 20 Gb/Sec.

"Holographic coupling elements for optical bus systems based on a light-guiding optical backplane", Haumann et al., SPIE Vol. 1319, Optics in Complex Systems (1990), describes an optical backplane consisting of a light-guiding glass plate, with holographic coupling elements for coupling the light from sources into the backplane and from the backplane onto detectors with high efficiency. However, all these essentially optical techniques are costly and cumbersome. Moreover, optical alignment does not provide an optimal solution for alignment problems that are caused by changes in ambient conditions (e.g., temperature effects) or by aging of electrical components.

All the methods described above have not yet provided satisfactory solutions to the problem of aligning optical interconnections between printed circuit boards (PCBs), which overcome the drawbacks of the prior art.

It is an object of the present invention to provide a method and apparatus for aligning optical interconnections between printed circuit boards (PCBs), which employ electric control.

It is another object of the present invention to provide a method and apparatus for aligning optical interconnections between printed circuit boards (PCBs), which provide an adaptive compensation in response to varying ambient conditions.

It is a further object of the present invention to provide a method and apparatus for aligning optical interconnections between printed circuit boards (PCBs), which provide a simple compensation for mechanical tolerances.

Other objects and advantages of the invention will become apparent as the description proceeds.

SUMMARY OF THE INVENTION

The present invention is directed to a method for the alignment of optical interconnections between at least one optical data transmission point and at least one corresponding optical data receiving point. A collimated beam of data carrying light is polarized through an electrically-controlled light polarizer, such as a spatial light modulator or a liquid crystal, which comprises an array of pixels. A focused beam of data-carrying light is obtained by controlling the polarization of each pixel. More specifically, the method employs a data carrying light source, such as a laser diode for transmission from the transmission point, an optical sensor, such as a photo-diode or a photo-transistor, for receiving data carrying light at the receiving point. The sensor provides an electrical signal which is related to the energy contained in the data-carrying light. An electrically-controlled light polarizer consisting of an array of pixels, is located between the data transmission and receiving points, such that the beam of the data-carrying light is forced to pass essentially through at least one active areas of the polarizer. The beam is collimated with a lens, e.g., a Fresnel lens, or a diffractive lens, such that the collimated beam passes through a plurality of pixels. A focused beam of the data-carrying light, emitted from the light polarizer, is obtained on the receiving point, by individually controlling the polarization of each pixel, and deflecting the direction of the collimated beam when emitted from the light polarizer, until a predetermined value of the electrical signal is obtained. Additional focusing can be obtained by using a focusing lens located between the light polarizer and the receiving point. The collimated beam can be further continuously and/or adaptively aligned by determining a desired bit error rate and a threshold current and/or voltage produced by the optical sensor, which corresponds to the rate. The comparator circuitry compares the actual current and/or voltage produced by the optical sensor, to the threshold current and/or voltage, and a feedback loop controls each individual pixel according to the comparison result. The comparator generates an error signal whenever the actual current and/or voltage produced by the optical sensor is different from the threshold current and/or voltage. The error signal is fed into the feedback loop and the control signal to one or more pixels is adjusted until the error signal is reduced essentially to zero.

The invention is also directed to an apparatus for the alignment of optical interconnections between at least one optical data transmission point and at least one corresponding optical data receiving point. The apparatus comprises light emitting means, light collimating means and light-receiving means, and further comprises an electrically-controlled light polarizer consisting of an array of pixels, for focusing a collimated beam of data-carrying light. More specifically, the apparatus comprises:

a) a data-carrying light source for transmission from the transmission point;

b) an optical sensor for receiving the data carrying light at the receiving point, the sensor providing an electrical signal which is related to the energy contained in the data-carrying light;

c) an electrically-controlled light polarizer consisting of an array of pixels, located between the data transmission and receiving points, such that the beam of the data-carrying light is forced to pass essentially through at least one of the active areas of the polarizer;

d) a lens for collimating the beam, such that the collimated beam passes through a plurality of pixels; and e) circuitry for individually controlling the polarization of each pixel, and deflecting the direction of the collimated beam when emitted from the light polarizer, until a predetermined value of the electrical signal is obtained.

In order to provide adaptive alignment, the apparatus further comprises:

a) a comparator circuitry for comparing the actual current and/or voltage produced by the optical sensor, to a threshold current and/or voltage;

b) a feedback loop for controlling each individual pixel according to the comparison result;

c) circuitry for generating an error signal by the comparator, whenever the actual current and/or voltage produced by the optical sensor is different from the threshold current and/or voltage;

d) electrical connection for feeding the error signal into the feedback loop; and e) circuitry for adjusting the control signal to one or more pixels until the error signal is reduced essentially to zero.

The invention is also directed to a data communication system, which comprises means for the alignment of optical interconnections between at least one optical data transmission point and at least one corresponding optical data receiving point. The means employed in such system comprises light emitting means, light collimating means and light-receiving means, and further comprises an electrically-controlled light polarizer consisting of an array of pixels, for focusing a collimated beam of data-carrying light. The polarizer may be controlled adaptively, to compensate for dynamic and/or time dependent deflections of the collimated beam from focus.

The invention is further directed to a data communication system for the alignment of optical interconnections between at least two optical data transmission points and at least two corresponding optical data receiving points, which comprising:

a) at least two data-carrying light sources for transmission from different transmission point;

b) at least two optical sensor for receiving the data carrying light at the corresponding receiving points, each of the sensors providing an electrical signal which is related to the energy contained in its destined data-carrying light;

c) an electrically-controlled light polarizer consisting of an array of pixels, located between the at least two data transmission points and their corresponding at least two data receiving points, such that different beams of each data-carrying light are forced to pass essentially through different active areas of the polarizer;

d) at least one lens for collimating the different beams, such that each collimated beam passes through a different group of pixels of the polarizer; and e) circuitry for individually controlling the polarization of each pixel in each group of pixels, and deflecting the direction of each collimated beam when emitted from its corresponding active area of the light polarizer, until a predetermined value of the electrical signal is obtained at each receiving point.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 1:
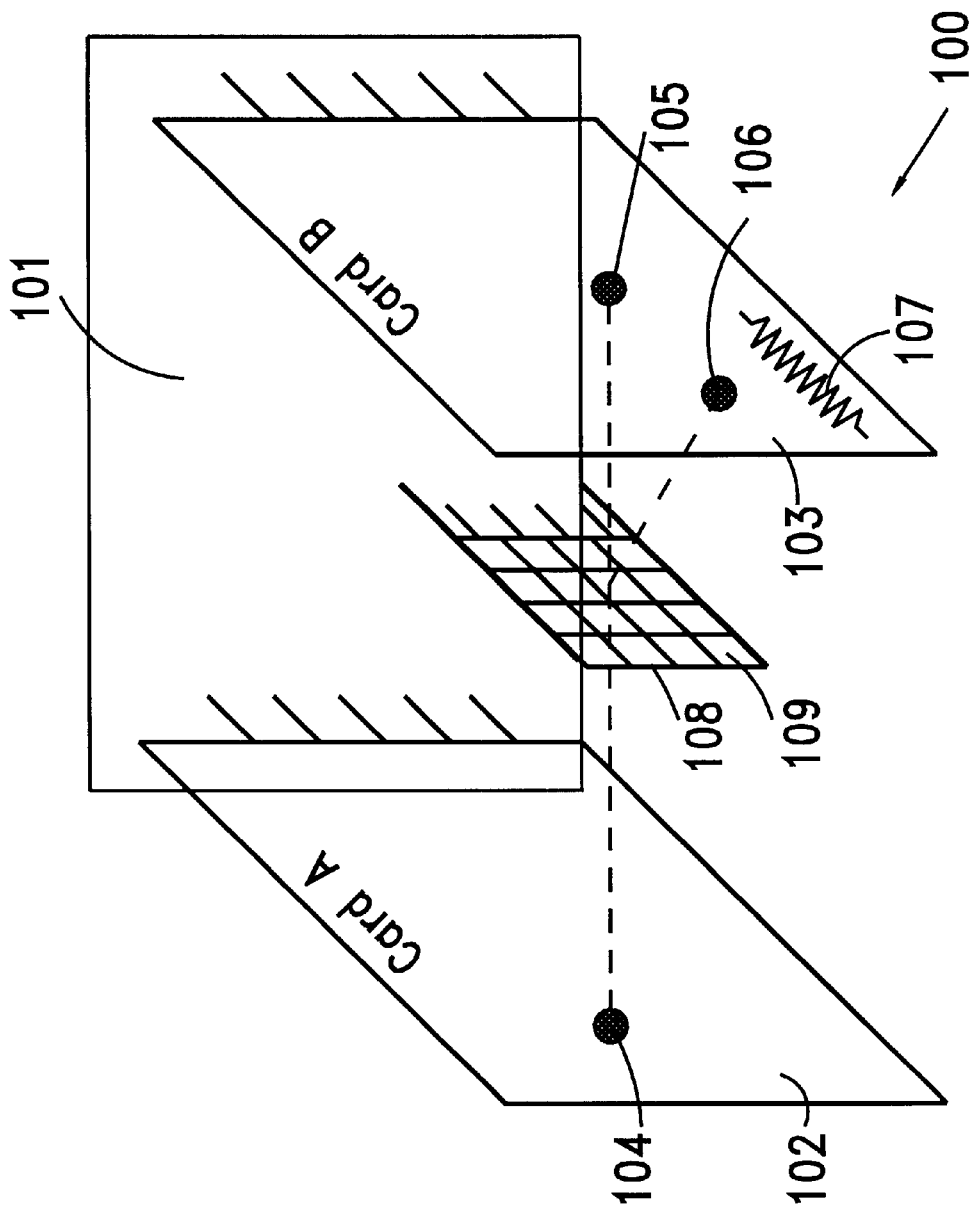
FIG. 1 schematically illustrates a PCB array consisting of a backplane having two inserted electronic PCBs, with an electronically controlled aligned optical interconnection between them, according to a preferred embodiment of the invention.

FIG. 1 schematically illustrates a PCB array consisting of a backplane having two inserted electronic PCBs with an electronically-controlled aligned optical interconnection between them, according to a preferred embodiment of the invention. The array 100 comprises two electronic cards, 102 and 103, which are inserted into a backplane 101. Backplane 101 provides the required voltage to each card, and optionally a data bus connection between the cards. Card 102 comprises a light source, such as a laser diode located on card 102 in point 104, which emits light that is modulated by the data that should be transmitted from card 102 to card 103. The receiving card 103 comprises a corresponding optical sensor 107, such as a photodiode or a phototransistor, located at point 106 on card 103. The direct line connecting between points 104 and 105 on cards 102 and 103, respectively, simulates the theoretical path (a straight line) of light emitted at point 104 toward the receiving card 103. The relative location of points 104 and 105 on each card is designed to coincide with the theoretical straight line. However, in practice such coincidence almost does not exist because of manufacturing tolerances in the dimensions of each card, as well as tolerances in the mechanical connection between each card and the backplane. Other tolerances result from the fact that the connecting pins of each card are not inserted with a repeatable force into their mating sockets on the backplane. In the worst case, several, or all of, these tolerances are combined, and therefore, the actual location of the optical sensor 107 is shifted from the desired point 105 to another point 106 on the backplane.

Assuming that the power distribution of the emitted light beam is essentially normal (Gaussian distribution), most of its power is concentrated around the original direction, which is the line connecting between points 104 and 105. Therefore, misalignment caused by the deflection of the optical sensor 107 to point 106, leads to a situation where only a relatively low energy (the "tail" of the Gaussian curve) reaches the optical sensor 107. Low energy of an information-carrying signal usually increases the Bit Error Rate (BER) due to noise effects. Increased BER is totally unacceptable in such data communication systems, especially when the distance between cards is relatively small. Therefore, lower BERs can be obtained by aligning the light beam, so as to reach point 106 with most of the transmitted energy.

According to a preferred embodiment of the invention, an electrically-controlled light polarizer 108 is inserted between cards 102 and 103, so that the light beam crosses the active area of the light polarizer 108. Such light polarizer may be, for example a Spatial Light Modulator (SLM), or a Liquid Crystal (LC). The light polarizer 108 consists of an array of individually-controlled polarization elements 109, commonly called "pixels". Each pixel 109 changes the polarization of the portion of the light beam that passes through it, and causes a slight deflection in the direction of that portion. The level of deflection, as well as the new direction, are determined by the control voltage (level and polarity), which is supplied to each pixel. Therefore, the light beam that is received by the light polarizer 108 in the original direction which coincides with the straight line connecting between points 104 and 105, leaves its surface in a different direction, toward the shifted point 106. The light polarizer 108 is inserted into the backplane 101, which mechanically fixes it in place, and provides the power supply and control contacts (inputs) to each pixel 109.

Figure 2:
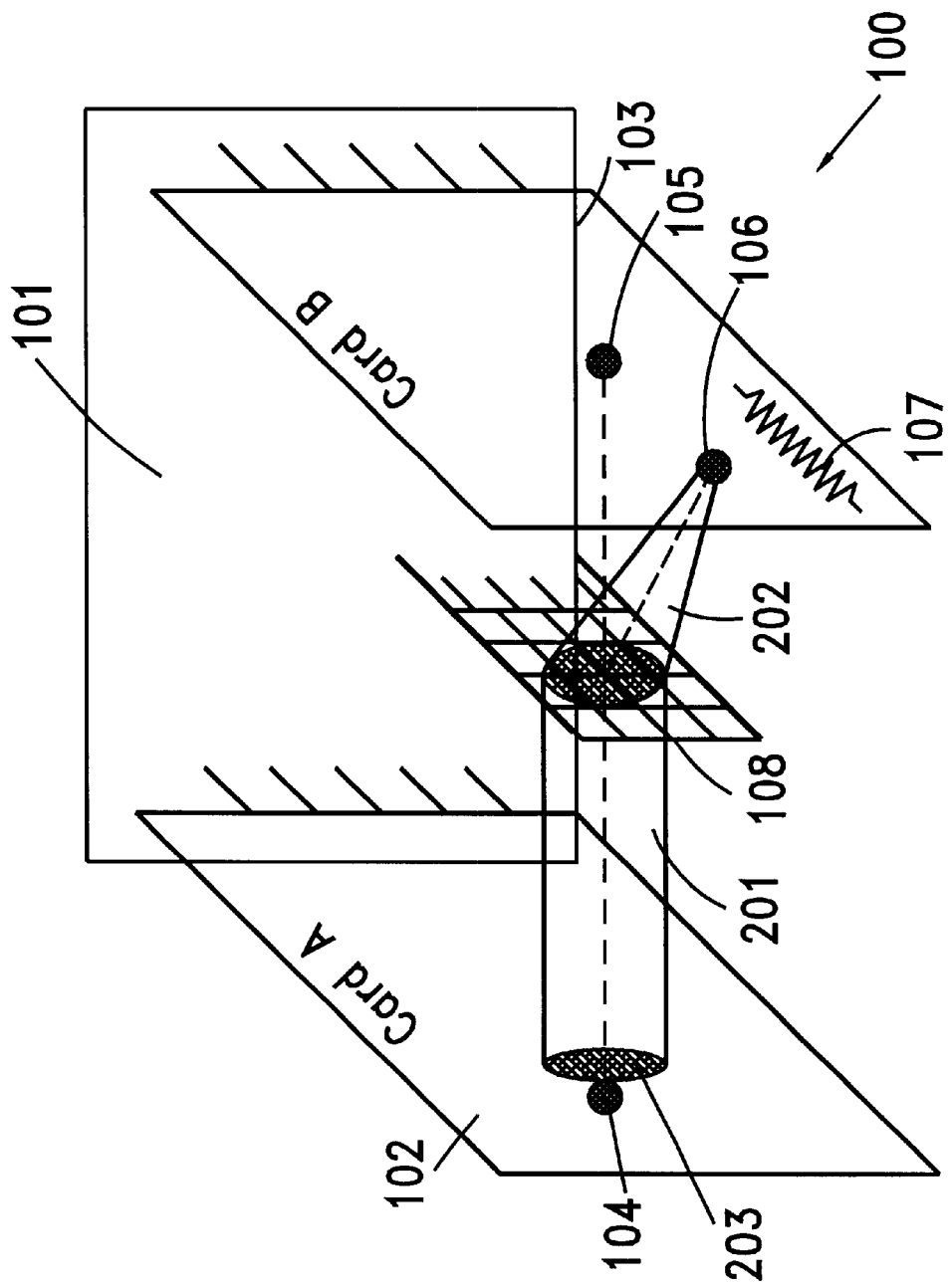
FIG. 2 schematically illustrates the structure of the array of FIG. 1, with collimation of the incident light beam, according to a preferred embodiment of the invention.

FIG. 2 schematically illustrates the structure of the array of FIG. 1, with collimation of the incident light beam, according to a preferred embodiment of the invention. In order to effectively control the light beam that is emitted by the light source located at point 104, a collimating lens, such as a Fresnel lens (or another diffractive lens) 203, is attached to the light source and is located between the light source and the light polarizer 108, so that its focal axis essentially coincides with the direction from point 104 to point 105. The lens 203 causes the concentrated Laser beam to collimate, and generate a plain wave that propagates toward the surface of the light polarizer 108. The collimated beam 201 is obtained with essentially cylindrical shape, with a diameter (determined by the Fresnel lens 203) that forces the beam to pass through as many pixels as possible, when reaching the surface of the light polarizer 108. By doing so, the light energy is split into many pixels, and therefore can be controlled and directed by the surface of the light polarizer 108 more accurately. Each pixel is controlled by a control circuit which may reside on, or be external to, the backplane 101. The resulting beam 202 is a conical beam, that consists of a plurality of light beams, each of which is deflected and directed by a corresponding pixel to point 106. Hence, the light energy is concentrated at point 106, and the undesired shift in the location of the optical sensor 107 is compensated. The light polarizer 108 may be also controlled to deflect the incident plain wave to the desired direction. In this case, the deflected "cylindrical" beam can be focused at point 106 by using a focusing lens which is attached to the receiving card 103. Alternatively, the deflected "cylindrical" beam can be focused by the light polarizer 108, which can act as a beam former.

Figure 3:
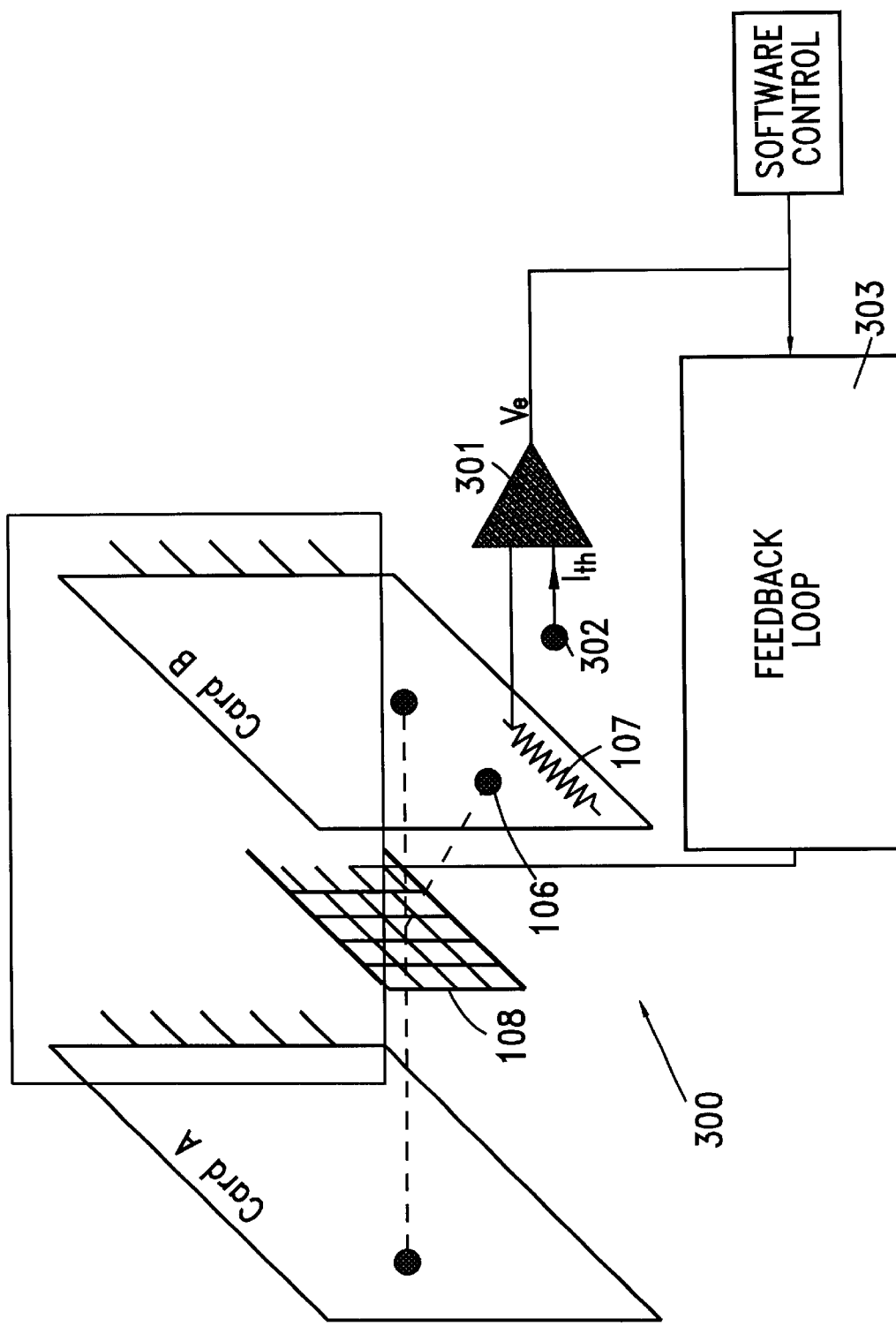
FIG. 3 schematically illustrates the structure of the array of FIG. 1 or FIG. 2, with adaptive control of the deflection level of the incident light beam, according to another preferred embodiment of the invention.

FIG. 3 schematically illustrates the structure of the array of FIG. 1 or FIG. 2, with adaptive control of the deflection level of the incident light beam, according to a preferred embodiment of the invention. As explained above, even after obtaining a sufficient alignment of the light beam at point 106, at fixed mechanical conditions (i.e., at a static state and at fixed temperature), this alignment is deteriorated by external factors which may continuously vary as a result of environmental conditions, such as ambient temperature, vibrations, mechanical shock or aging (i.e., slight changes in the electrical/optical attributes of the components after an operation time period). Such deterioration decreases the light energy that is received by the optical sensor 107, and therefore the BER increases.

According to a preferred embodiment of the invention, a feedback loop which senses deviations from optimal alignment, and provides a corresponding correction voltage to the light polarizer 108, is employed. The feedback loop 300 consists of a comparator 301, which samples the current of the optical sensor 107, and compares it to a predetermined threshold current $I_{th}$. The optical sensor 107 outputs a current (and/or a voltage) level which is related to the energy of light received at point 106, and the BER of the optical interconnection is inversely related to that energy. Therefore, by keeping the alignment with sufficient accuracy, the BER can also be kept under a desired level. The threshold current $I_{th}$ is designed so that the BER does not exceeds the maximal defined level. For example, in typical data communication systems a BER of $10^{-10}$ is still acceptable. As long as the detected current provided by the optical sensor 107 is essentially equal to the threshold current $I_{th}$, the output of the comparator 301 is essentially zero, and therefore no change in the current alignment is required. On the other hand, if there is any change in the current alignment, which results from external factors, the comparator 301 outputs an error voltage $V_e$, which is fed into a feedback loop 303. The feedback loop 303 is linked to a software control, which controls its operation, so as to change the polarization of several pixels, or of all the pixels of the light polarizer 108, in a direction that reduces the generated error voltage $V_e$ back to zero (i.e., back to the desired BER). The feedback loop 303 outputs a set of control voltages, one for each individual pixel. Alternatively, the feedback loop 303 can be hardware-controlled.

According to a preferred embodiment of the invention, the operation of the feedback loop 303 is designed so that at the first step the control voltage to each pixel is adjusted to obtain the maximal value of detected current that can be reached. The polarization of each pixel 109 is adjusted so that the incident light that is received on each pixel is deflected and focused on a different point on the plane of the optical sensor 107. At the next step, the alignment is adjusted continuously and adaptively, so as to maintain the value of the detected current at the maximal available level.

According to a preferred embodiment of the invention, several optical interconnections having adaptive alignment capabilities can be operated between cards. The spacing between the locations of the corresponding light sources, as well as between their corresponding receiving points at the opposing card, is designed to be sufficiently large. This spacing ensures that the collimated beams are sufficiently far from each other, and therefore, interference between adjacent interconnection paths is eliminated.

The above examples and description have of course been provided only for the purpose of illustration, and are not intended to limit the invention in any way. As will be appreciated by the skilled person, the invention can be carried out in a great variety of ways, such as aligning two or more data-carrying light beams originated at one card by two or more corresponding groups of pixels of the same polarizer, employing more than one technique from those described above, all without exceeding the scope of the invention.

What is claimed is:

1. A method for the alignment of optical interconnections between at least one optical data transmission point and at least one corresponding optical data receiving point, comprising:

a) providing a data carrying light source for transmission from said transmission point;

b) providing an optical sensor for receiving data carrying light at said receiving point, said sensor providing an electrical signal which is related to the energy contained in said data-carrying light;

c) providing an electrically-controlled light polarizer consisting of an array of pixels, located between said data transmission and receiving points, such that the beam of said data-carrying light is forced to pass essentially through at least one active area of said polarizer in order to be polarized;

d) collimating said beam with a lens, such that the collimated beam passes through a plurality of the pixels; and e) obtaining a focused beam of said data-carrying light, emitted from said light polarizer, on said receiving point, by individually controlling the polarization of each pixel, and deflecting the direction of said collimated beam when emitted from said light polarizer, until a predetermined value of said electrical signal is obtained.

2. A method according to claim 1, wherein said step of obtaining a focused beam comprises emitting the collimated beam from a lens located between the light polarizer and the receiving point, deflecting the emitted beam and focusing the deflected beam.

3. A method according to claim 1, wherein the at least one data transmission point and the at least one receiving point are located on different and opposing printed circuit boards.

4. A method according to claim 1, wherein the light beam is modulated by transmitted data.

5. A method according to claim 1, wherein the data-carrying light is emitted by a laser diode at the optical data transmission point.

6. A method according to claim 1, wherein the focused beam is received at the optical data receiving point by an optical sensor composed of a photo-diode or a photo-transistor.

7. A method according to claim 1, further comprising providing an electrical signal that is related to the energy contained in the focused beam, wherein the electrical signal is a current level proportional to the intensity of the focused beam.

8. A method according to claim 1, wherein the electrically controlled light polarizer is a spatial light modulator, or a liquid crystal.

9. A method according to claim 1, further comprising forming the collimated beam with a Fresnel lens, or a diffractive lens.

10. A method according to claim 1, further comprising providing an electrical signal that is related to the energy contained in the focused beam at the optical data receiving point, and controlling the light polarizer to deflect the direction of the focused beam until a predetermined value of said electrical signal is obtained, wherein the predetermined value of the electrical signal corresponds to a desired bit error rate.

11. A method for the alignment of optical interconnections between at least one optical data transmission point and at least one corresponding optical data receiving point, comprising polarizing a collimated beam of data carrying light through an electrically-controlled light polarizer comprising an array of pixels, obtaining a focused beam of data-carrying light by controlling the polarization of each pixel, and continuously and/or adaptively aligning the collimated beam by the steps of:

a) determining a desired bit error rate and a threshold current and/or voltage produced by an optical sensor at the optical data receiving point, which corresponds to said rate;

b) providing a comparator circuitry for comparing the actual current and/or voltage produced by said optical sensor, to said threshold current and/or voltage;

c) providing a feedback loop for controlling each individual pixel according to the comparison result;

d) generating an error signal by said comparator, whenever said actual current and/or voltage produced by said optical sensor is different from said threshold current and/or voltage;

e) feeding said error signal into said feedback loop; and f) adjusting the control signal to one or more pixels until said error signal is reduced essentially to zero.

12. A data communication system for the alignment of optical interconnections between at least one optical data transmission point and at least one corresponding optical data receiving point comprising:

light emitting means;

light collimating means;

an electrically-controlled light polarizer comprising an array of pixels, for focusing a collimated beam of data-carrying light, coupled to at least one optical data receiving point;

light receiving means including an optical sensor at the optical data receiving point for producing a current and/or voltage in response to light arriving at the optical data receiving point from the polarizer;

at least one comparator circuitry for comparing the actual current and/or voltage produced by the optical sensor, to a threshold current and/or voltage;

at least one feedback loop for controlling each individual pixel according to the comparison result;

circuitry for generating an error signal by said comparator, whenever said actual current and/or voltage produced by said optical sensor is different from said threshold current and/or voltage;

electrical connection for feeding said error signal into said feedback loop; and circuitry for adjusting a control signal supplied by the feedback loop to one or more pixels until said error signal is reduced essentially to zero.

13. A data communication system according to claim 12, further comprising circuitry for controlling each feedback loop by software.

14. Apparatus for the alignment of optical interconnections between at least one optical data transmission point and at least one corresponding optical data receiving point, comprising:

a) a data-carrying light source for transmission of data carrying light from said transmission point;

b) an optical sensor for receiving said data carrying light at said receiving point, said sensor providing an electrical signal which is related to the energy contained in said data carrying light;

c) an electrically-controlled light polarizer consisting of an array of pixels, located between said data transmission and receiving points, such that the beam of said data-carrying light is forced to pass essentially through at least one active area of said polarizer;

d) a lens for collimating said beam, such that the collimated beam passes through a plurality of the pixels; and e) circuitry for individually controlling the polarization of each pixel, and deflecting the direction of said collimated beam when emitted from said light polarizer, until a predetermined value of said electrical signal is obtained.

15. Apparatus according to claim 14, in which the data transmission and receiving points are located on different and opposing printed circuit boards.

16. Apparatus according to claim 14, in which light from said light source is modulated by transmitted data.

17. Apparatus according to claim 14, in which the data-carrying light source is a laser diode.

18. Apparatus according to claim 14, in which the optical sensor is a photo-diode or a photo-transistor.

19. Apparatus according to claim 14, in which the electrical signal is a current and/or voltage level, proportional to the intensity of the received light.

20. Apparatus according to claim 14, in which the electrically controlled light polarizer is a spatial light modulator, or a liquid crystal.

21. Apparatus according to claim 14, in which the lens is a Fresnel lens, or a diffractive lens.

22. Apparatus according to claim 15, in which the opposing printed circuit boards are connected to each other via a data bus of a backplane, into which said opposing printed circuit boards are inserted.

23. Apparatus according to claim 14, in which the predetermined value of the electrical signal corresponds to a desired bit error rate.

24. Apparatus according to claim 14, further comprising means for focusing the beam after it has been deflected by said circuitry and emitted from a lens located between the light polarizer and the receiving point.

25. Apparatus according to claim 14, further comprising:

a) a comparator circuitry for comparing the actual current and/or voltage produced by the optical sensor, to a threshold current and/or voltage;

b) a feedback loop for controlling each individual pixel according to the comparison result;

c) circuitry for generating an error signal by said comparator, whenever said actual current and/or voltage produced by said optical sensor is different from said threshold current and/or voltage;

d) electrical connection for feeding said error signal into said feedback loop; and e) circuitry for adjusting the control signal to one or more pixels until said error signal is reduced essentially to zero.

26. Apparatus according to claim 25, further comprising circuitry for controlling the feedback loop by software.

27. A data communication system for the alignment of optical interconnections between at least two optical data transmission points and at least two corresponding optical data receiving points, comprising:

a) at least two data-carrying light sources for transmission from different transmission points;

b) at least two optical sensors for receiving said data carrying light at said corresponding receiving points, each of said sensors providing an electrical signal which is related to the energy contained in its destined data-carrying light;

c) an electrically-controlled light polarizer comprising an array of pixels, located between said at least two data transmission points and their corresponding at least two data receiving points, such that different beams of each data-carrying light are forced to pass essentially through different active areas of said polarizer;

d) at least one lens for collimating said different beams, such that each collimated beam passes through a different group of pixels of said polarizer, each group of pixels being in a respectively different active area of said polarizer; and e) circuitry for individually controlling the polarization of each pixel in each group of pixels, and deflecting the direction of each collimated beam when emitted from its corresponding active area of said light polarizer, until a predetermined value of said electrical signal is obtained at each receiving point.

28. A data communication system according to claim 27, in which the data transmission and receiving points are located on different and opposing printed circuit boards.

29. A data communication system according to claim 27, in which the data carrying light is modulated by transmitted data.

30. A data communication system according to claim 27, in which the data carrying light is emitted by a laser diode at the optical data transmission point.

31. A data communication system according to claim 27, wherein each said optical sensor is composed of a photo-diode or a photo-transistor.

32. A data communication system according to claim 27, wherein at least one of the electrical signals is a current and/or voltage level, proportional to the intensity of the light received by one of the optical sensors.

33. A data communication system according to claim 27, in which at least one of the electrically-controlled light polarizers is a spatial light modulator, or a liquid crystal.

34. A data communication system according to claim 27, said at least one lens is constituted by a Fresnel lens, or a diffractive lens.

35. A data communication system according to claim 27, wherein the predetermined value of the electrical signal obtained at each receiving point corresponds to a desired bit error rate.

* * * * *